United States Patent [19]

Bruening et al.

[11] Patent Number: 5,013,921
[45] Date of Patent: May 7, 1991

[54] X-RAY DETECTOR

[75] Inventors: Horst Bruening, Goessweinstein; Wolfgang Schubert, Erlangen, both of Fed. Rep. of Germany

[73] Assignee: Siemens Aktiengesellschaft, Munich, Fed. Rep. of Germany

[21] Appl. No.: 404,635

[22] Filed: Sep. 8, 1989

[30] Foreign Application Priority Data

Sep. 26, 1988 [EP] European Pat. Off. ........... 88115837

[51] Int. Cl.$^5$ .............................................. G01T 1/20
[52] U.S. Cl. ........................... 250/370.11; 250/370.01
[58] Field of Search ..................... 250/370.11, 370.01, 250/484.1 R, 361 R, 367

[56] References Cited

U.S. PATENT DOCUMENTS

| 4,734,588 | 3/1988 | Akai | 250/370 |
| 4,799,094 | 1/1989 | Rougeot | 357/30 |
| 4,845,363 | 7/1989 | Akai | 250/370.11 |

FOREIGN PATENT DOCUMENTS

| 0036530 | 9/1981 | European Pat. Off. . |
| 0126417 | 11/1984 | European Pat. Off. . |
| 0275446 | 7/1988 | European Pat. Off. . |
| 0172272 | 10/1982 | Japan | 250/370.11 |
| 2005405 | 4/1979 | United Kingdom . |

OTHER PUBLICATIONS

"Large-Area Electronics Based on Amorphous Silicon," Kempter, Festkoerperprobleme 27 (1987), pp. 279-305.

*Primary Examiner*—Edward P. Westin
*Assistant Examiner*—Richard Hanig
*Attorney, Agent, or Firm*—Hill, Van Santen, Steadman & Simpson

[57] ABSTRACT

An x-ray detector includes a scintillation element having a radiation entry side and a radiation exit side disposed in succession in a direction of radiation propagation, with respective photosemiconductor layers in optical contact with the scintillation element being disposed on both the radiation entry side and the radiation exit side of the scintillation element. The layers on each side are separated to form a succession of discrete photodiodes, and the photodiodes on one side of the scintillation element may be offset relative to the photodiodes on the other side of the scintillation element.

2 Claims, 1 Drawing Sheet

SWITCHING STAGE

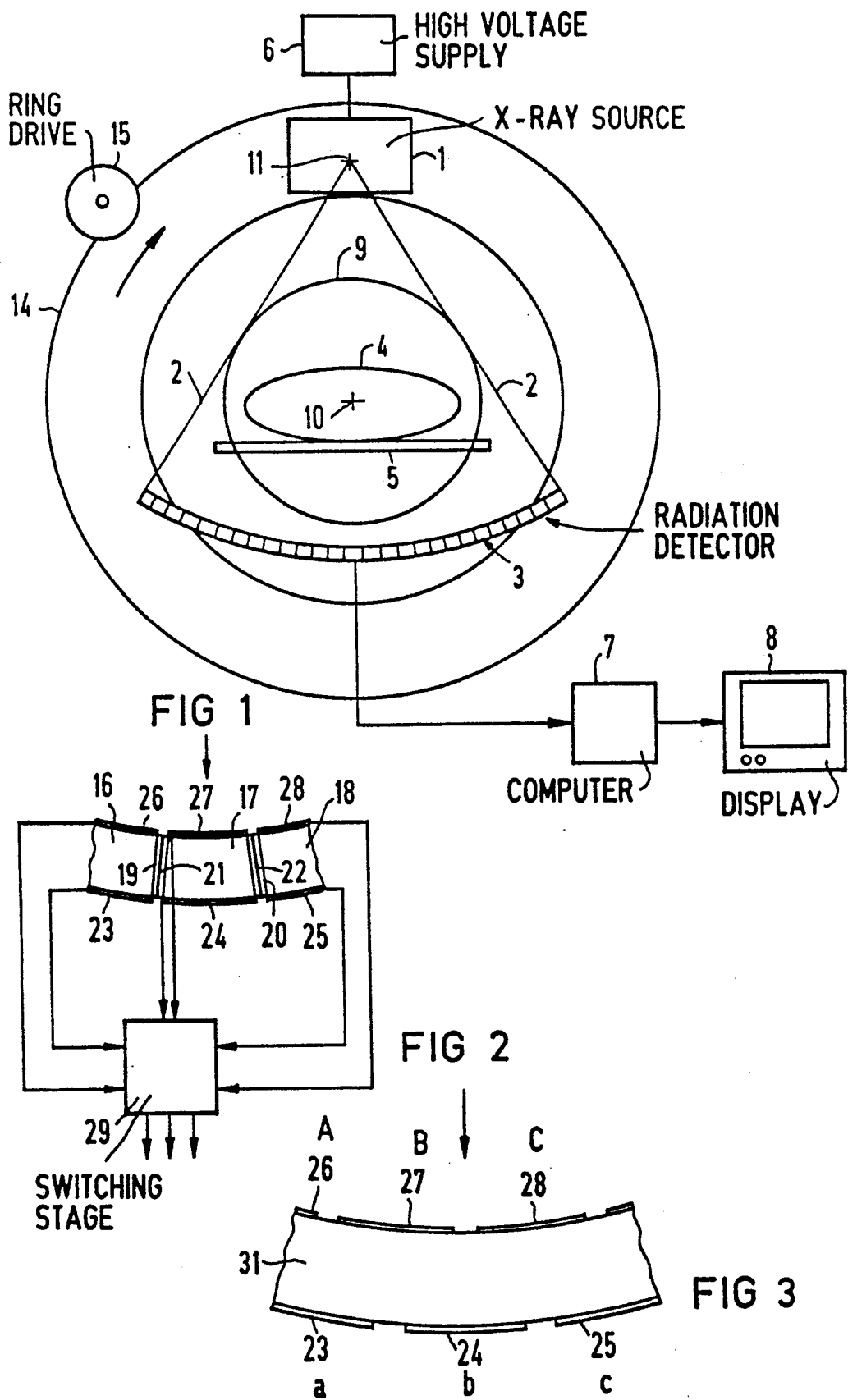

X-RAY DETECTOR

BACKGROUND OF THE INVENTION

1. Field of the Invention

The present invention is directed to a detector for x-radiation of the type having a scintillation element with a photosemiconductor layer, forming a photodiode, in optical contact with the scintillation element.

2. Description of the Prior Art

X-ray detectors used, for example, in computer tomography and in computer radiography, are known which consist of a scintillation element having a radiation exit side (i.e., a side farthest from the radiation source) on which a crystalline silicon photodiode embedded in transparent plastic is glued. The gluing causes optical losses due to reflection and scatter. Moreover, the manufacture of such a combination is relatively complicated.

It is known from the U.S. Pat. No. 4,799,094 to construct an x-ray detector using a photosemiconductor layer consisting of amorphous hydrogenated silicon (a-Si:H) which can be applied directly on the scintillation element in thin-film technology. This permits the use of scintillator materials which are not transparent, and in particular permits the use of translucent scintillator materials, due to the increased efficiency in the use of the generated light.

SUMMARY OF THE INVENTION

It is an object of the present invention to provide an x-ray detector of the type including a scintillation element and a photosemiconductor layer in optical contact therewith wherein optimum light exploitation is achieved with a simple fabrication process.

The above object is achieved in accordance with the principles of the present invention in an x-ray detector wherein a photosemiconductor layer is disposed both on the radiation entry side of the scintillation element and on the radiation exit side of the scintillation element.

The photosemiconductor layer is only about one to five micrometer thick, and has such a low x-ray absorption that it can be applied to the radiation entry side of the scintillation element without increasing the relative signal noise. By applying a photosemiconductor layer both to the radiation entry side and the radiation exit side of the scintillation element, a higher output signal is achieved with either a parallel connection or a series connection of the two photosemiconductor layers allocated to each other than is achieved using only one photosemiconductor layer per channel. The use of two photosemiconductor layers per detector element also provides the possibility of separately processing the output signals of both photosemiconductor layers in a channel so that separate documentation of radiation in different spectral regions can be made.

The sandwich structure of photosemiconductor-scintillation element-photosemiconductor also provides the possibility of using scintillation elements which are not transparent, such as many single crystals, but which are only translucent, such as polycrystalline and sintered scintillators.

The photosemiconductor layer is preferably an a-Si:H layer applied to the scintillation element in thin-film technology, and is divided into a plurality of separate photodiodes in a large-area array. Due to the use of thin-film technology, a considerable cost reduction is achieved in the fabrication. In addition to photodiodes consisting of a-Si:H, it is also possible to employ hydrogenated compounds of amorphous silicon such as, for example, a-Si$_x$Ge$_y$:H, a-Si$_x$C$_y$:H or a-Si$_x$N$_y$:H to adapt the spectral sensitivity of the photodiodes to the scintillation light of the scintillator (x and y indicating the proportions of the respective elements). It is also possible to use a photoresistor structure instead of a photodiode. The signal current of the detector can be increased by a multiple in this manner.

DESCRIPTION OF THE DRAWINGS

FIG. 1 is a schematic block diagram of a computer tomography apparatus in which an x-ray detector constructed in accordance with the principles of the present invention can be employed.

FIG. 2 is a side sectional view of a portion of a radiation detector constructed in accordance with the principles of the present invention, connected to a switching stage, in a first embodiment.

FIG. 3 is a side sectional view of a portion of a radiation detector constructed in accordance with the principles of the present invention in a second embodiment.

DESCRIPTION OF THE PREFERRED EMBODIMENTS

A computer tomography apparatus in which the radiation detector disclosed herein can be used is schematically shown in FIG. 1. The tomography apparatus includes an x-ray source 1 which is fed by a high voltage supply 6. The x-ray source 1 emits a fan-shaped x-ray beam 2. Radiation attenuated by an examination subject 4 disposed on a support table 5 is incident on a radiation detector 3. The radiation detector 3 may consist of a series of individual detectors, for example 512 individual detectors.

The examination subject 4 is disposed in an examination volume 9, with the radiation source and the radiation detector 3 being mounted on a live ring 14 on opposite sides of the examination subject 4. To conduct a scan, the live ring (and thus the x-ray source and the radiation detector 3) are rotated by a ring drive 15 in the direction of the arrow. A scan is conducted by rotating the x-ray source 1 and the radiation detector 3 around the examination volume 9, and thus around the patient 4 disposed in the volume 9, through 360°. Sets of data are generated at predetermined angular positions of the x-ray source 1 and the radiation detector 3. These data sets are supplied from the radiation detector 3 to a computer 7 which calculates the attenuation coefficients of predetermined picture elements in a known manner from the generated data sets, and constructs an image therefrom. The image is visually portrayed on a display 8.

A first embodiment of a radiation detector constructed in accordance with the principles of the present invention is shown in FIG. 2. In this embodiment, a series or row of scintillation elements 16, 17 and 18 are present, which are separated from each other by slots 19 and 20 which are filled with a reflector material (such as, for example, TiO$_2$ or MgO with or without binder). Respective light- and/or X ray impermeable layers 21 and 22 are provided between the individual detector elements to prevent crosstalk.

Incoming x-radiation, propagating in the direction of the arrow shown in FIG. 2, is incident in succession on an entry face and an exit face of each detector element.

A photosemiconductor layer, such as an a-Si:H layer, is directly applied on the respective beam exit sides of each scintillation element 16, 17 and 18 thereby forming discrete photodiodes 23, 24 and 25. Similarly, a photosemiconductor layer, such as a-Si:H, is applied to the respective entry sides of the scintillation elements 16, 17 and 18, thereby forming further discrete photodiodes 26, 27 and 28. For this purpose, the surfaces of the entry side and exit side of the scintillation elements 16, 17 and 18 are polished.

In combination with the respective photodiodes, the scintillation elements 16, 17 and 18 (as well as others, not shown) form an array which constitutes the radiation detector 3 shown in FIG. 1.

An electronic switching stage 29 is also shown in FIG. 2, which supplies output signals to the computer 7 produced by each parallel connection of two photodiodes, such as the pair 23 and 26, the pair 27 and 24 and the pair 25 and 28. Alternatively, the switching stage 29 may forward the output signals of each photodiode individually. In the former instance, a high channel signal is generated, whereas in the latter instance, different spectral regions of the x-radiation can be documented according to the known dual energy method.

A further embodiment of a radiation detector constructed in accordance with the principles of the present invention is shown in FIG. 3. In this embodiment, a scintillation element 31 is provided in the form of a monolithic block, again having a radiation exit side and a radiation entry side on which a-Si:H photodiodes 23, 24, 25, 26, 27 and 28 are respectively disposed. The photodiodes 23, 24, and 25 are laterally offset relative to the photodiodes 26, 27 and 28 with respect to the radiation propagation direction indicated by the arrow in FIG. 3. This permits the individual signals from the respective photodiodes to be combined or weighted in a selected manner to enhance the resolution in comparison to resolution obtained from conventional aligned photodiodes, i.e., without offset. An example of a signal combination which can be undertaken in the embodiment of FIG. 3 is:

| |
|---|
| $B + (a + b)/2$ = first measured value |
| $b + (B + C)/2$ = second measured value |
| $C + (b + c)/2$ = third measured value. |

The scintillation elements 16, 17, 18 and 31 can be manufactured single-crystalline or polycrystalline by melting and cooling, extruding, sintering with or without the application of pressure at suitable temperatures, or by embedding a powdered scintillation material in a binder that is thermoplastically used or is used as a multi-component system.

Although the invention has been described in the form of a detector array, the inventive concepts disclosed herein are equally applicable to the construction of a single x-ray detector having only one scintillation element with both the entry face and exit face covered with an a-Si:H photodiode, or any type of amorphous hydrogenated silicon photosemiconductor.

Although modifications and changes may be suggested by those skilled in the art, it is the intention of the inventors to embody within the patent warranted hereon all changes and modifications as reasonably and properly come within the scope of their contribution to the art.

We claim our invention:

1. A detector for radiation propagating in a propagation direction comprising:
    a scintillation element having a radiation entry face and a radiation exit face disposed in succession in the direction of radiation propagation; and
    first and second amorphous hydrogenated silicon semiconductor layers respectively disposed on and in optical contact with each of said entry face and said exit face of said scintillation element.

2. A detector as claimed in claim 1, wherein said first and second layers are laterally offset relative to each other with respect to said radiation propagation direction.

* * * * *